(12) United States Patent
Jeong et al.

(10) Patent No.: US 7,974,115 B2
(45) Date of Patent: Jul. 5, 2011

(54) ONE-TIME PROGRAMMABLE DEVICES INCLUDING CHALCOGENIDE MATERIAL AND ELECTRONIC SYSTEMS INCLUDING THE SAME

(75) Inventors: Chang-Wook Jeong, Seoul (KR); Jun-Hyok Kong, Seoul (KR); Hyung-Rok Oh, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/638,599

(22) Filed: Dec. 15, 2009

(65) Prior Publication Data
US 2010/0090213 A1    Apr. 15, 2010

Related U.S. Application Data

(62) Division of application No. 11/564,751, filed on Nov. 29, 2006, now Pat. No. 7,656,694.

(30) Foreign Application Priority Data

Jul. 4, 2006    (KR) .................. 10-2006-0062675

(51) Int. Cl.
*G11C 17/00*    (2006.01)
(52) U.S. Cl. .................. 365/96; 365/100; 365/225.7
(58) Field of Classification Search .................. 365/96, 365/100, 225.7
See application file for complete search history.

(56) References Cited

U.S. PATENT DOCUMENTS

| | | | |
|---|---|---|---|
| 6,438,059 B2 | 8/2002 | Akita et al. | |
| 6,448,576 B1 * | 9/2002 | Davis et al. .................. 257/50 |
| 6,580,144 B2 | 6/2003 | Anthony | |
| 6,597,031 B2 | 7/2003 | Kuge | |
| 6,657,531 B2 | 12/2003 | Kimura et al. | |
| 6,686,644 B2 | 2/2004 | Tatematsu et al. | |
| 6,703,680 B2 | 3/2004 | Toyoshima | |
| 6,800,504 B2 * | 10/2004 | Li et al. .................. 438/102 |
| 6,928,022 B2 | 8/2005 | Cho et al. | |
| 6,940,777 B2 | 9/2005 | Ooishi | |
| 6,944,050 B2 | 9/2005 | Kang et al. | |
| 7,052,941 B2 | 5/2006 | Lee | |
| 7,227,802 B2 | 6/2007 | Jung et al. | |
| 7,233,539 B2 | 6/2007 | Boas et al. | |
| 7,238,994 B2 | 7/2007 | Chen et al. | |

(Continued)

FOREIGN PATENT DOCUMENTS

CN    101292350 A    10/2008

(Continued)

OTHER PUBLICATIONS

IPO Office Action issued May 31, 2010 and Search Report completed May 21, 2010, Ref. Taiwan Patent Application No. 096107738, 7 pages.

(Continued)

*Primary Examiner* — VanThu Nguyen
*Assistant Examiner* — Hien N Nguyen
(74) *Attorney, Agent, or Firm* — Myers Bigel Sibley & Sajovec PA

(57) ABSTRACT

A switching device disposed in a substrate is turned on and a program current is applied to a fuse electrically connected to a switching device, thereby cutting the fuse. The fuse includes a first electrode electrically connected to the switching device, a second electrode spaced apart from the first electrode, and a chalcogenide pattern disposed between the first and second electrodes.

19 Claims, 12 Drawing Sheets

U.S. PATENT DOCUMENTS

| | | | |
|---|---|---|---|
| 7,369,452 B2 | 5/2008 | Kenkare et al. | |
| 2004/0113137 A1 | 6/2004 | Lowrey | |
| 2006/0278895 A1* | 12/2006 | Burr et al. | 257/209 |

FOREIGN PATENT DOCUMENTS

| | | |
|---|---|---|
| JP | 2003-17572 A | 1/2003 |
| JP | 2004-103604 A | 4/2004 |
| JP | 2005-85980 A | 3/2005 |
| KR | 2003-0027859 A | 4/2003 |
| KR | 2003-0045603 A | 6/2003 |
| KR | 2003-0051153 A | 6/2003 |
| KR | 10-2004-0053767 A | 6/2004 |
| KR | 10-2004-0060169 A | 7/2004 |
| KR | 10-2005-0003326 A | 1/2005 |
| KR | 10-0572622 | 4/2006 |
| TW | 484146 | 4/2002 |
| TW | 233444 | 6/2005 |
| TW | 200623488 | 7/2006 |

OTHER PUBLICATIONS

Decision to Grant Patent, Korean Application No. 10-2006-0062675, Nov. 5, 2007.

Office Action and English translation, Chinese Patent Application No. 200710127820.7, May 8, 2009.

* cited by examiner

ONE-TIME PROGRAMMABLE DEVICES INCLUDING CHALCOGENIDE MATERIAL AND ELECTRONIC SYSTEMS INCLUDING THE SAME

CROSS-REFERENCE TO RELATED APPLICATIONS

This application is a divisional of U.S. application Ser. No. 11/564,751 filed Nov. 29, 2006, now U.S. Pat. No. 7,656,694 and claims the benefit under 35 USC §119 of Korean Patent Application No. 10-2006-0062675, filed Jul. 04, 2006, the disclosure of which is hereby incorporated herein by reference in its entirety as if set forth fully herein.

FIELD OF THE INVENTION

The present invention relates to semiconductor devices and electronic systems including the same and, more particularly, to one-time programmable devices, memory devices having the same, electronic systems including the same, and methods of operating the same.

BACKGROUND OF THE INVENTION

An electronic system may include one or more integrated circuit devices, such as a microprocessor, an input/output (I/O) unit, a programmable gate array, and a memory device. The memory device may include a redundancy repair circuit. Functions or circuit configurations of devices having the redundancy repair circuit may be changed when a predetermined programming operation is performed thereon after the devices are fabricated.

Memory devices may be classified into volatile memory devices and nonvolatile memory devices. A phase change memory device is one well known nonvolatile memory device. The phase change memory device may include an array of phase change memory cells disposed in a cell region of a substrate. The phase change memory cell includes a switching device and a data storage element serially connected to the switching device. The data storage element may have top and bottom electrodes and a phase change material layer therebetween, whereon one of the electrodes is electrically connected to the switching device. The phase change material may comprise a chalcogenide material.

However, when one of the cells is defective, the phase change memory device may fail to properly operate. To cope with this, a technique of providing the redundancy repair circuit is widely employed. The redundancy repair circuit includes one or more fuses in a fuse region of the substrate. A test process is used to find the defective cell, and a repair process is used to cut the fuse connected to the defective cell. In this case, the defective cell is replaced with a corresponding redundancy memory cell by the redundancy repair circuit.

The method of cutting the fuse may include melting the fuse with a laser beam. In this case, in order to prevent an adjacent fuse from being damaged while the fuse connected to the defective cell is cut, an interval between the fuses should be larger than the region irradiated with the laser beam. Thus, reduction of the interval between fuses may be limited by the size of the region irradiated by the laser beam. In addition, it may be difficult to stack other devices on the fuses. Consequently, employing the method of cutting fuses with a laser beam may reduce the integration density of the device.

In order to deal with this problem, the fuse connected to the defective cell may be electrically cut. Conventional fuses are formed of a polysilicon layer or a metal layer. A high driving current may be supplied to cut the fuse connected to the defective cell. As a high driving current may be needed, the size of the switching device may also need to be relatively large. The large switching device may consume excessive area and/or power.

Meanwhile, other methods of forming a fuse are disclosed in Korean Patent Publication No. 2003-0045603 entitled "Programmable Element, Programmable Circuit and Semiconductor Device" to Toyoshima Yoshiaki, corresponding to U.S. Pat. No. 6,703,680, issued Mar. 9, 2004. Yet other methods of forming a fuse are disclosed in Korean Patent Publication No. 10-2005-0003326 entitled "Three Dimensional IC Structure and Fabricating Method Thereof for Forming Various Semiconductor Devices Having Vertical Structure By Applying Three-Dimensional IC" to Sang Yun Lee, corresponding to U.S. Pat. No. 7,052,941, issued May 30, 2006.

Finally, a fuse device is described in Japanese Patent Publication No. 2004-103604 entitled "Fuse Device" to Matsuo Mie et al. As described in the English language translation of the Abstract of this patent publication, the fuse device is equipped with an insulating film formed on a semiconductor substrate, and a fuse which is formed inside the insulating film and changed in resistance with the phase transition caused by the heat from a heating means to set information. The phase transition fuse is made of a chalcogen or an alloy bringing about a martensite transformation. After the fuse is heated, it is quickly cooled down so as to store the information.

SUMMARY OF THE INVENTION

Some embodiments of the present invention provide methods of programming a fuse that comprises chalcogenide material. These methods supply sufficient current through the fuse to cut the fuse that comprises the chalcogenide material. In some embodiments, the chalcogenide material itself is cut.

Other embodiments of the invention are directed to methods of programming a one-time programmable device that includes a switching device and a fuse in the substrate that are electrically connected to one another. These programming methods comprise turning on the switching device to apply a sufficient program current to cut the fuse. The fuse includes a first electrode connected to the switching device, a second electrode spaced apart from the first electrode, and a chalcogenide pattern electrically connecting the first electrode to the second electrode.

Other embodiments of the present invention are directed to fuses themselves. These fuses may comprise a substrate and a fuse body that comprises chalcogenide material on the substrate. The fuse body includes a cut portion therein that separates the fuse body into two closely spaced apart portions. In some embodiments, the chalcogenide material itself includes the cut portion.

Other embodiments of the present invention are directed to one-time programmable devices. The one-time programmable devices comprise a switching device disposed in a substrate. A fuse is electrically connected to the switching device. The fuse includes a first electrode electrically connected to the switching device, a second electrode spaced apart from the first electrode, and a chalcogenide pattern disposed between the first and second electrodes. The fuse is cut when the switching device is turned on and a program current is applied to the fuse.

In some exemplary embodiments of the present invention, the switching device may have a current drivability that can cut the fuse. In addition, the switching device may comprise a metal oxide semiconductor (MOS) transistor, a plurality of MOS transistors connected in parallel with each other, a diode and/or a plurality of diodes connected in parallel with each other.

In other exemplary embodiments, a contact region between the first electrode and the chalcogenide pattern may have a smaller width than the chalcogenide pattern.

In still other exemplary embodiments, at least a portion of the chalcogenide pattern may have a cross-sectional area smaller than a contact region between the first electrode and the chalcogenide pattern.

In some exemplary embodiments, a portion of the first electrode may be cut by the applied program current. In other embodiments, a contact region between the first electrode and the chalcogenide pattern may be cut by the applied program current. In still other embodiments, a portion of the chalcogenide pattern itself may be cut by the applied program current.

In yet other exemplary embodiments, the first electrode may comprise Ti, Zr, Hf, V, Nb, Ta, W, TiN, ZrN, HfN, VN, NbN, TaN, WN, CoSi, TiSi, TaSi, NiSi, TiAlN, TiCN, TaCN, TiSiN, and/or TaSiN.

In yet other exemplary embodiments, the chalcogenide pattern may comprise an alloy of Germanium (Ge), Stibium (Sb), and Tellurium (Te).

Still other embodiments of the present invention provide integrated circuit phase change memory devices. These phase change memory devices include an array of phase change memory cells that comprise a phase change material in an integrated circuit substrate. An array of redundant phase change memory cells that comprise the phase change material is also provided in the integrated circuit substrate. A circuit is also provided in the integrated circuit substrate that is configured to substitute one redundant phase change memory cell for at least one phase change memory cell that is defective. The circuit includes at least one fuse that comprises the phase change material.

Phase change memory devices according to other embodiments of the invention comprise a substrate including a cell array region, a redundancy cell array region, and a redundancy repair circuit region. A phase change memory cell is disposed in the cell array region. A redundancy memory cell is disposed in the redundancy cell array region. A switching device is disposed in the redundancy repair circuit region. A fuse is electrically connected to the switching device. The fuse comprises a first electrode electrically connected to the switching device, a second electrode spaced apart from the first electrode, and a chalcogenide pattern disposed between the first and second electrodes. The fuse is cut when the switching device is turned on and a program current is applied to the fuse.

Yet other embodiments of the present invention are directed to an electronic system comprising a microprocessor, an input/output unit communicating data with the microprocessor, and a one-time programmable device communicating data with the microprocessor. The one-time programmable device of the electronic system comprises a switching device disposed in a substrate. A fuse is electrically connected to the switching device. The fuse comprises a first electrode electrically connected to the switching device, a second electrode spaced apart from the first electrode, and a chalcogenide pattern disposed between the first and second electrodes. The fuse is cut when the switching device is turned on and a program current is applied to the fuse.

DETAILED DESCRIPTION OF THE INVENTION

Figure 1:
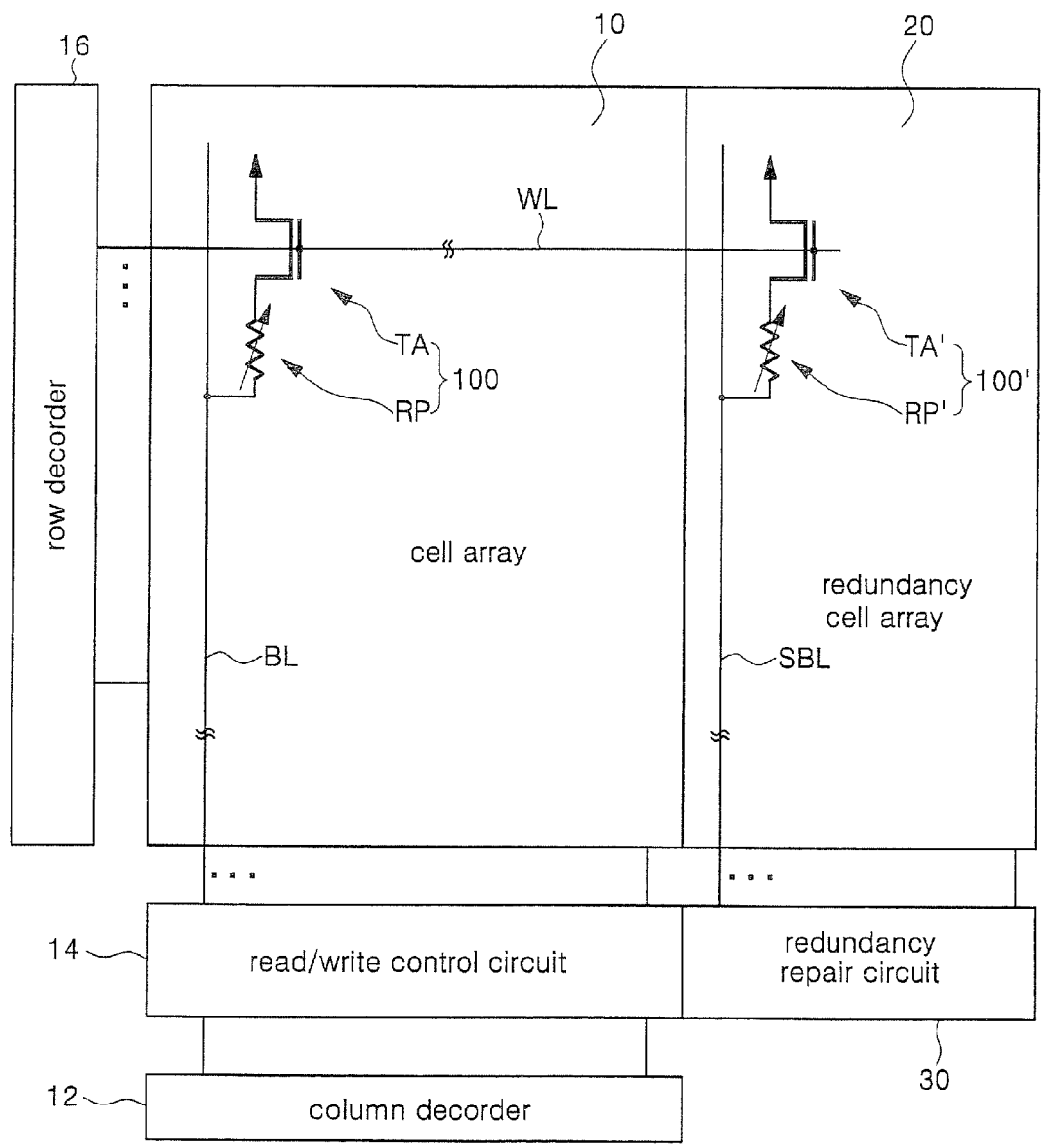
FIG. 1 schematically illustrates a phase change memory device having a one-time programmable device in accordance with some embodiments of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the example term "below" can encompass both an orientation of above and below. The device may be otherwise oriented (rotated 90° or at other orientations) and the spatially relative descriptors used herein interpreted accordingly. Moreover, the term "beneath" indicates a relationship of one layer or region to another layer or region relative to the substrate, as illustrated in the figures.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to plan and cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

First, phase change memory devices having a one-time programmable device and a redundancy repair circuit according to some embodiments of the present invention will be described with reference to FIGS. 1 and 2.

Referring to FIG. 1, phase change memory devices having a one-time programmable device according to some embodiments of the present invention includes a cell array region 10, a redundancy cell array region 20, a row decoder 16, a read/write control circuit 14, a column decoder 12, and a redundancy repair circuit region 30.

The cell array region 10, i.e., a memory cell region, has a plurality of word lines WL, a plurality of bit lines BL, and a plurality of phase change memory cells 100. The bit lines BL may cross the word lines WL, and the phase change memory cells 100 may be disposed at intersections of the word lines WL and the bit lines BL.

The redundancy cell array region 20 may be adjacent to the cell array region 10. The plurality of word lines WL may extend into the redundancy cell array region 20. The redundancy cell array region 20 may have a plurality of switching bit lines SBL and redundancy memory cells 100'. The switching bit lines SBL may cross the word lines WL, and the redundancy memory cells 100' may be disposed at intersections of the word lines WL and the switching bit lines SBL.

Each of the phase change memory cells 100 includes a phase change resistor RP electrically connected to one of the bit lines BL, and a cell switching device electrically connected to the phase change resistor RP. The phase change resistor RP may include first and second terminals and a phase change material layer interposed between the first and second terminals, and the cell switching device may include an access transistor TA having a gate electrode, a source region, and a drain region. In some embodiments, the first terminal of the phase change resistor RP is electrically connected to the drain region of the access transistor TA, and the second terminal of the phase change resistor RP is electrically connected to the bit line BL. In addition, the gate electrode of the access transistor TA is electrically connected to any one of the word lines WL, and the source region of the access transistor TA is electrically connected to the source line.

Each of the redundancy memory cells 100' includes another phase change resistor RP' electrically connected to one of the switching bit lines SBL, and a redundancy cell switching device electrically connected to the phase change resistor RP'. The redundancy cell switching device may be another access transistor TA' having a gate electrode, a source region, and a drain region.

The row decoder 16 may be disposed at one side of the cell array region 10, and electrically connected to the word lines WL. The row decoder 16 may act to select any one of the word lines WL.

The column decoder 12 may be disposed at another side of the cell array region 10, and electrically connected to the bit lines BL via the read/write control circuit 14. The column decoder 12 may act to select the bit lines BL. The read/write control circuit 14 may be disposed between the column decoder 12 and the cell array region 10.

The redundancy repair circuit region 30 may be adjacent to the read/write control circuit 14. The redundancy repair circuit region 30 may have a redundancy repair circuit. The redundancy repair circuit may be electrically connected to the read/write control circuit 14 and the column decoder 12. The redundancy repair circuit may act to replace a selected bit line BL with a selected switching bit line SBL. In this case, a defective phase change memory cell 100 may be replaced by a corresponding redundancy memory cell 100'.

Figure 2:
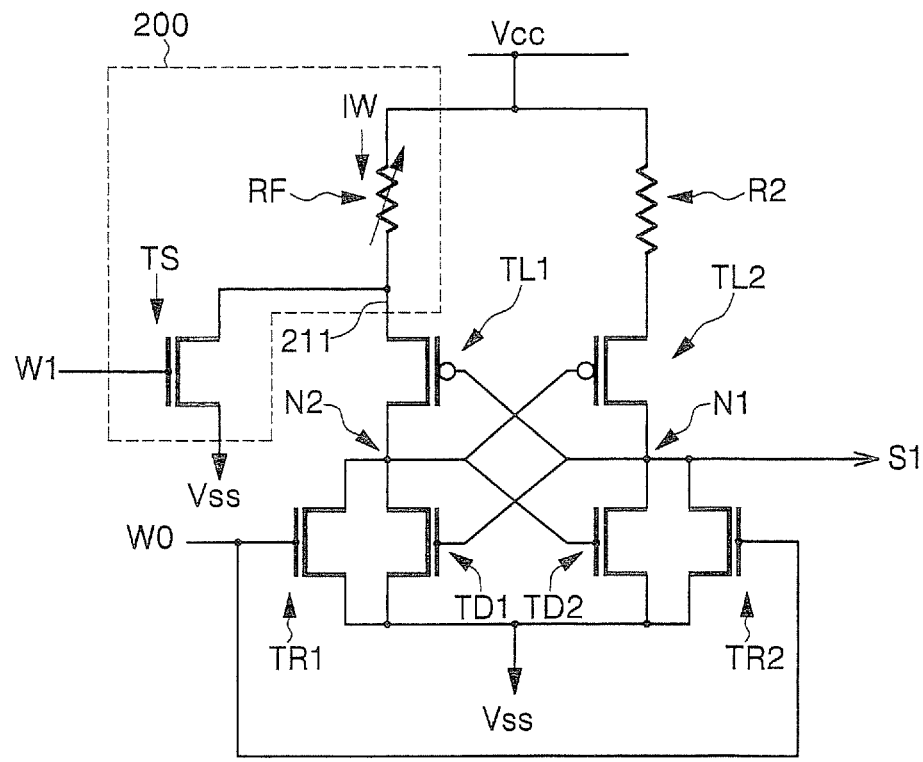
FIG. 2 is an equivalent circuit diagram of a redundancy repair circuit having a one-time programmable device in accordance with some embodiments of the present invention.

FIG. 2 is an equivalent circuit diagram of a redundancy repair circuit having a one-time programmable device in accordance with some embodiments of the present invention.

Referring to FIG. 2, the redundancy repair circuit may include a one-time programmable device 200, a fixed resistor R2, a pair of load transistors TL1 and TL2, a pair of drive transistors TD1 and TD2, and a pair of reset transistors TR1 and TR2.

The one-time programmable device 200 may include a switching device and a fuse RF. The switching device may be a switching transistor TS. A gate electrode of the switching transistor TS may be connected to a gate power line W1. A drain region of the switching transistor TS may be electrically connected to one end of the fuse RF through a first interconnection 211. The other end of the fuse RF may be connected to a power supply line Vcc. A source region of the switching transistor TS may be connected to a ground line Vss or a source line.

The drive transistors TD1 and TD2 and the reset transistors TR1 and TR2 may be N-type metal oxide semiconductor (NMOS) transistors, and the pair of load transistors TL1 and TL2 may be PMOS transistors.

A source region of the first load transistor TL1 may be electrically connected to one end of the fuse RF through the first interconnection 211. A source region of the second load transistor TL2 may be connected to one end of the fixed resistor R2. The other end of the fixed resistor R2 may be connected to the power supply line Vcc. That is, the fuse RF and the fixed resistor R2 may be electrically connected to the power supply line Vcc. The fuse RF may have an electrical resistance lower than the fixed resistor R2.

A source region of the first drive transistor TD1 may be electrically connected to the ground line Vss, and a drain region of the first drive transistor TD1 may be connected to a drain region of the first load transistor TL1. Similarly, a source region of the second drive transistor TD2 may be connected to the ground line Vss, and a drain region of the second drive transistor TD2 may be connected to a drain region of the second load transistor TL2.

The drain region of the second load transistor TL2 and the drain region of the second drive transistor TD2 correspond to a first node N1. The first node N1 may be connected to a control signal line S1. The drain region of the first load transistor TL1 and the drain region of the first drive transistor TD1 correspond to a second node N2. A gate electrode of the first load transistor TL1 and a gate electrode of the first drive transistor TD1 may be electrically connected to the first node N1. A gate electrode of the second load transistor TL2 and a gate electrode of the second drive transistor TD2 may be electrically connected to the second node N2.

A drain region of the first reset transistor TR1 may be electrically connected to the second node N2. A source region of the first reset transistor TR1 may be connected to the ground line Vss. A drain region of the second reset transistor TR2 may be connected to the first node N1. A source region of the second reset transistor TR2 may be connected to the ground line Vss. A gate electrode of the first reset transistor TR1 and a gate electrode of the second reset transistor TR2 may be connected to a reset gate power line W0.

When a reset gate voltage higher than a threshold voltage is applied to the reset gate power line W0, the first reset transistor TR1 and the second reset transistor TR2 may be turned on. In this case, the first node N1 and the second node N2 may have substantially the same potential difference as the ground line Vss. Subsequently, supplying the reset gate voltage is stopped, and a repair operation voltage is applied to the power line Vcc. In this case, the fuse RF has an electrical resistance lower than the fixed resistor R2, so that the second node N2 shows a relatively higher potential difference than the first node N1. That is, an output signal "0" may be obtained through the control signal line S1.

Meanwhile, when a program gate voltage higher than the threshold voltage is applied to the gate power line W1 and a program voltage is applied to the power line Vcc, a program current IW may flow through the fuse RF. In some embodiments, the program current IW has a magnitude that is sufficient to cut the fuse RF. In this case, the fuse RF may be cut by the applied program current IW. In addition, the switching transistor TS may have a current drivability that can cut the fuse RF.

As described above, the fuse RF has an electrical resistance lower than the fixed resistor R2. However, the cut fuse has an electrical resistance higher than the fixed resistor R2. In this case, when the repair operation voltage is applied to the power line Vcc, the first node N1 shows a relatively higher potential difference than the second node N2. That is, an output signal "1" may be obtained through the control signal line S1.

The output signal "0" and the output signal "1" may act to replace a selected bit line BL with a selected switching bit line SBL. Consequently, the redundancy repair circuit may act to replace a selected bit line BL with a selected switching bit line SBL. In this case, a defective phase change memory cell 100 may be replaced by a corresponding redundancy memory cell 100'.

Figure 3:
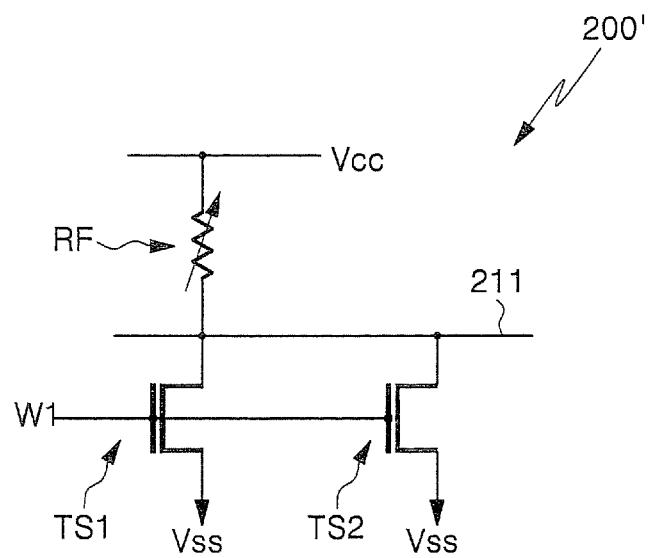
FIG. 3 is an equivalent circuit diagram illustrating a one-time programmable device in accordance with some embodiments of the present invention.

FIG. 3 is an equivalent circuit diagram illustrating a one-time programmable device in accordance with other embodiments of the present invention.

Referring to FIG. 3, a one-time programmable device 200' according to these embodiments of the present invention may include first and second switching transistors TS1 and TS2, and a fuse RF. The first and second switching transistors TS1 and TS2 may act as switching devices.

Gate electrodes of the first and second switching transistors TS1 and TS2 may be connected to a gate power line W1. Drain regions of the first and second switching transistors TS1 and TS2 may be electrically connected to one end of the fuse RF through a first interconnection 211. The other end of the fuse RF may be connected to a power supply line Vcc. Source regions of the first and second switching transistors TS1 and TS2 may be connected to a ground line Vss or a source line.

The first and second switching transistors TS1 and TS2 may be connected in parallel with each other, as illustrated in FIG. 3. Accordingly, they can have relatively high current drivability.

As described above with reference to FIG. 2, the program current IW may have a magnitude sufficient to cut the fuse RF. Therefore, the switching device should have a current drivability that can cut the fuse RE Accordingly, the switching device may be implemented by connecting a plurality of transistors parallel to each other.

A one-time programmable device and a method of operating the same according to some embodiments of the present invention will now be described with reference to FIGS. 4 to 7.

Figure 4:
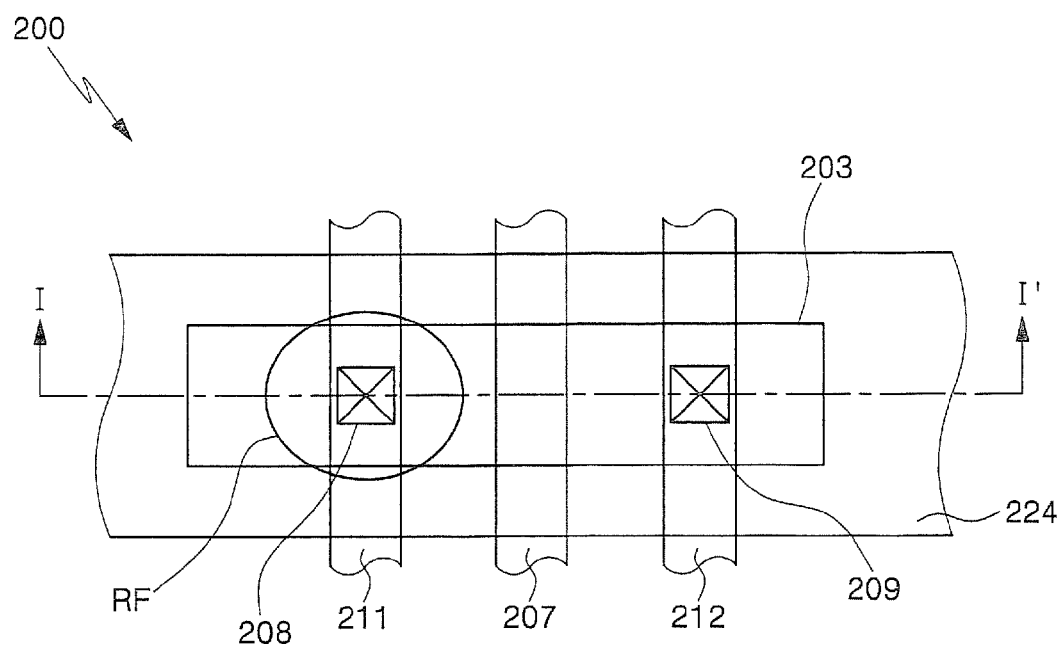
FIG. 4 is a plan view of a one-time programmable device in accordance with some embodiments of the present invention.
Figure 5:
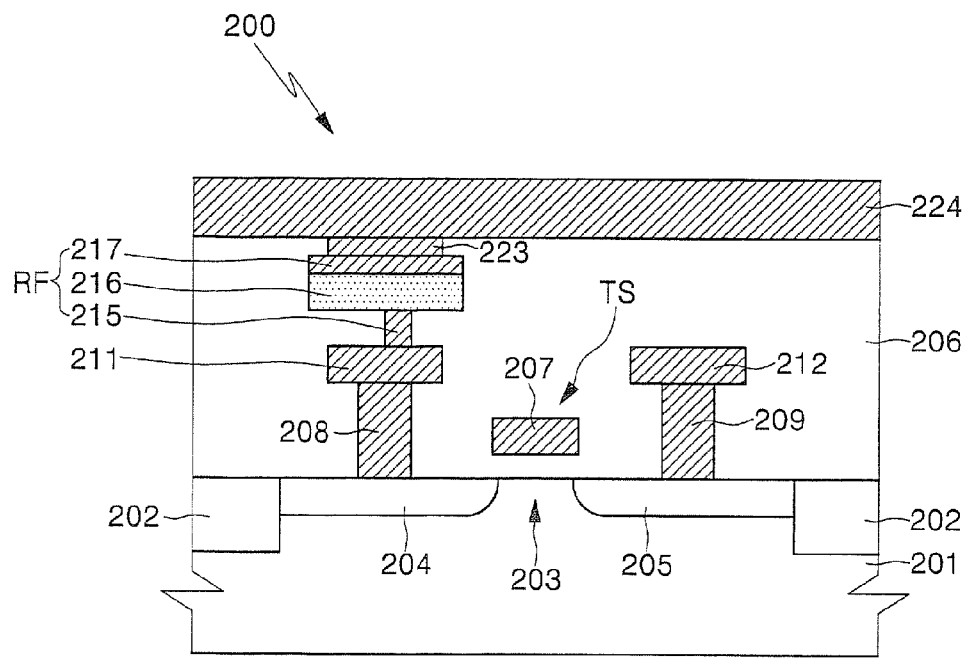
FIGS. 5 to 7 are cross-sectional views taken along line I-I' of FIG. 4 illustrating a program operation of a one-time programmable device in accordance with some embodiments of the present invention.

Referring to FIGS. 4 and 5, a one-time programmable device 200 according to some embodiments of the present invention may have an isolation layer 202 to define an active region 203 in a substrate 201. The substrate 201 may be a bulk wafer, such as a monocrystalline silicon wafer or a semiconductor-on-insulator (SOI) substrate. The isolation layer 202 may include an insulating material such as a silicon oxide layer.

An insulated gate electrode 207 may be disposed across the active region 203. A drain region 204 and a source region 205 may be disposed in the active region 203 adjacent to opposite sides of the gate electrode 207. The gate electrode 207 may include a polysilicon layer, a metal layer and/or a metal silicide layer. The drain region 204 and the source region 205 may be high-concentration impurity regions. The gate electrode 207, the active region 203, the drain region 204, and the source region 205 may constitute a switching transistor TS. The gate electrode 207 may be connected to the gate power line (W1 of FIG. 2).

The gate electrode 207, the drain region 204, and the source region 205 may be covered by an interlayer insulating layer 206. The interlayer insulating layer 206 may include an insulating layer, such as a silicon oxide layer, a silicon nitride layer and/or a silicon oxynitride layer.

A first interconnection 211 may be disposed within the interlayer insulating layer 206. The first interconnection 211 may be electrically connected to the drain region 204 by a first contact plug 208. A second interconnection 224 may be disposed on the interlayer insulating layer 206. A fuse RF may be disposed between the first interconnection 211 and the second interconnection 224. The fuse RF may be disposed within the interlayer insulating layer 206. The second interconnection 224 may be connected to a power supply line Vcc.

The fuse RF may include a first electrode 215, a second electrode 217, and a chalcogenide pattern 216. The first electrode 215 may be in contact with the first interconnection 211. The second electrode 217 may be disposed above the first electrode 215. The chalcogenide pattern 216 may be disposed between the first electrode 215 and the second electrode 217. As illustrated, a contact region between the first electrode 215 and the chalcogenide pattern 216 may have a smaller width than the chalcogenide pattern 216. The chalcogenide pattern 216 may electrically connect the first electrode 215 to the second electrode 217. The second electrode 217 may be electrically connected to the second interconnection 224 by a second contact plug 223.

The first interconnection 211, the first contact plug 208, the second interconnection 224, and the second contact plug 223 may include a polysilicon layer, a metal layer and/or a metal silicide layer. The first electrode 215 may include Ti, Zr, Hf, V, Nb, Ta, W, TiN, ZrN, HfN, VN, NbN, TaN, WN, CoSi, TiSi, TaSi, NiSi, TiAlN, TiCN, TaCN, TiSiN and/or TaSiN. The chalcogenide pattern 216 may be an alloy of Germanium (Ge), Stibium (Sb), and Tellurium (Te). The second electrode 217 may be a conductive layer such as a titanium nitride layer.

A third interconnection 212 may be disposed within the interlayer insulating layer 206. The third interconnection 212 may be electrically connected to the source region 205 by a third contact plug 209. The third interconnection 212 and the third contact plug 209 may include a polysilicon layer, a metal layer and/or a metal silicide layer. The third interconnection 212 may be connected to a ground line Vss or a source line.

Figure 6:
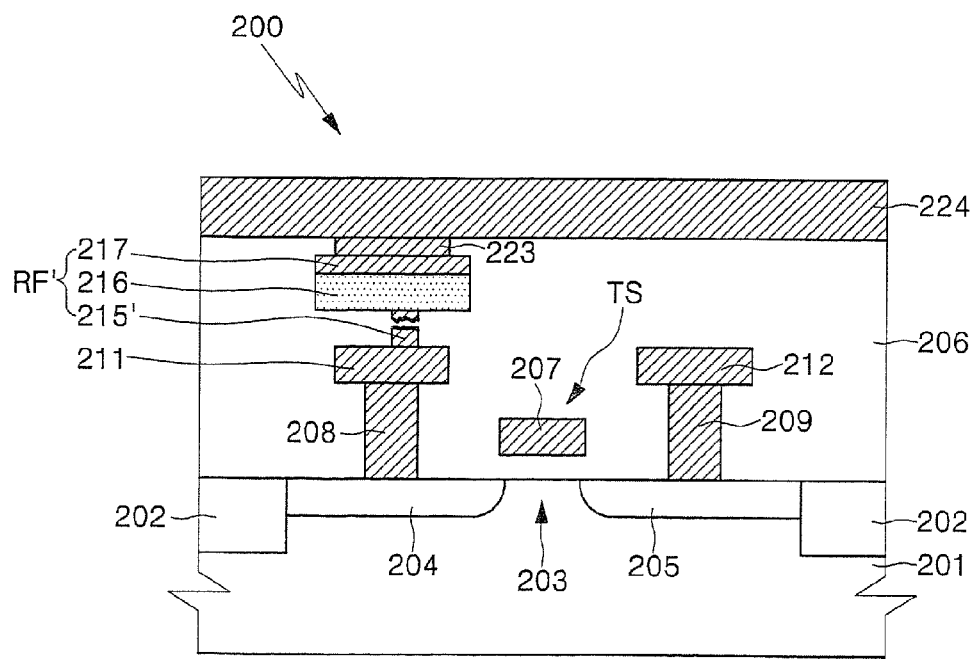

Referring to FIGS. 4 and 6, a program gate voltage higher than a threshold voltage may be applied to the gate electrode 207, and a program voltage may be applied to the second interconnection 224. In this case, a program current may flow through the fuse RF. When the program current has a magnitude that can cut the fuse RF, the fuse RF may be cut by the program current.

As shown in FIG. 6, the first electrode 215 may have a smaller cross-sectional area than the chalcogenide pattern 216. In addition, the first electrode 215 may have combined thin and thick patterns. The first electrode 215 may be cut by the program current. For example, the thinnest portion of the first electrode 215 may be cut. The switching transistor TS may have a current drivability that can cut the first electrode 215.

The cut first electrode 215' may act to electrically insulate the chalcogenide pattern 216 from the first interconnection 211. That is, the cut first electrode 215', the chalcogenide pattern 216, and the second electrode 217 may constitute a cut fuse RF'. The cut fuse RF' may have an electrical resistance higher than the fixed resistor (R2 of FIG. 2).

Figure 7:
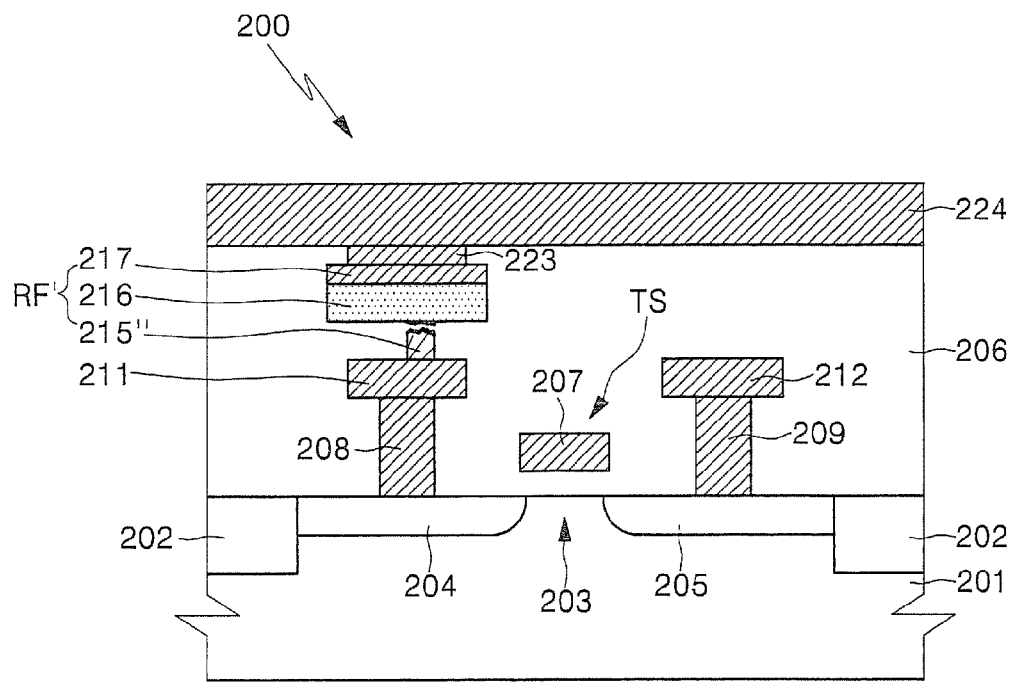

Referring to FIGS. 4 and 7, a contact region between the first electrode 215 and the chalcogenide pattern 216 may have a smaller width than the chalcogenide pattern 216. The contact region between the first electrode 215 and the chalcogenide pattern 216 may be cut by a program current.

Specifically, a program gate voltage higher than a threshold voltage may be applied to the gate electrode 207, and a program voltage may be applied to the second interconnection 224. In this case, a program current may flow through the fuse RF. When the program current has a magnitude that can cut the fuse RF, the fuse RF may be cut by the program current.

The first electrode 215" where the contact region is cut, the chalcogenide pattern 216, and the second electrode 217 may constitute a cut fuse RF'. The cut fuse RF' may have an electrical resistance higher than the fixed resistor (R2 of FIG. 2).

In some embodiments, the contact region between the first electrode 215 and the chalcogenide pattern 216 may be cut even by a relatively small program current compared to the fuse formed of the conventional metal or polysilicon layer. Accordingly, the size of the switching device may be reduced or minimized. That is, a one-time programmable device advantageous to high integration may be implemented.

Figure 8:
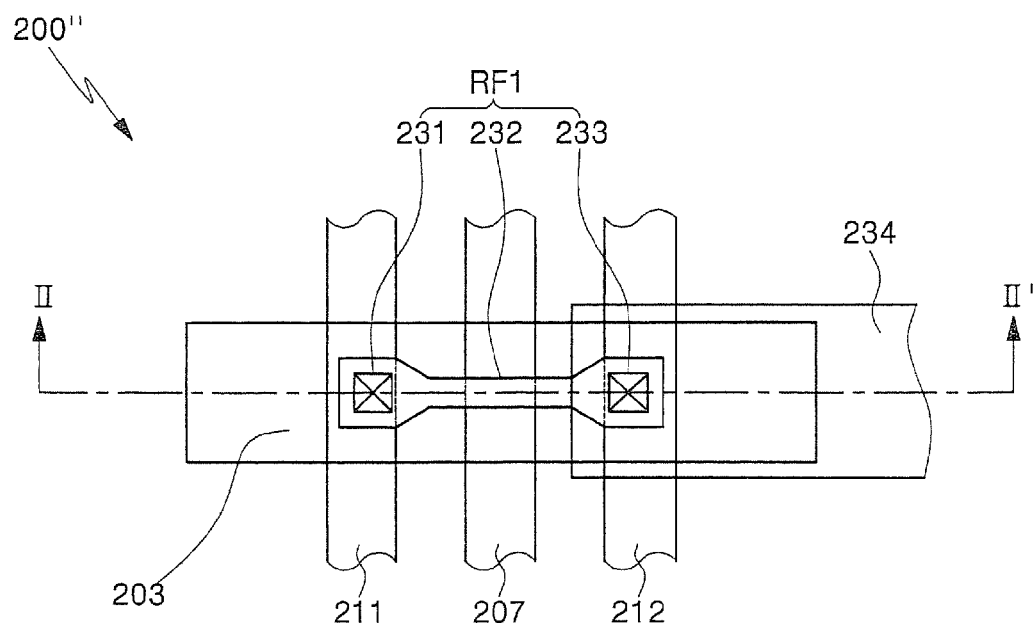
FIG. 8 is a plan view of a one-time programmable device in accordance with some embodiments of the present invention.
Figure 9:
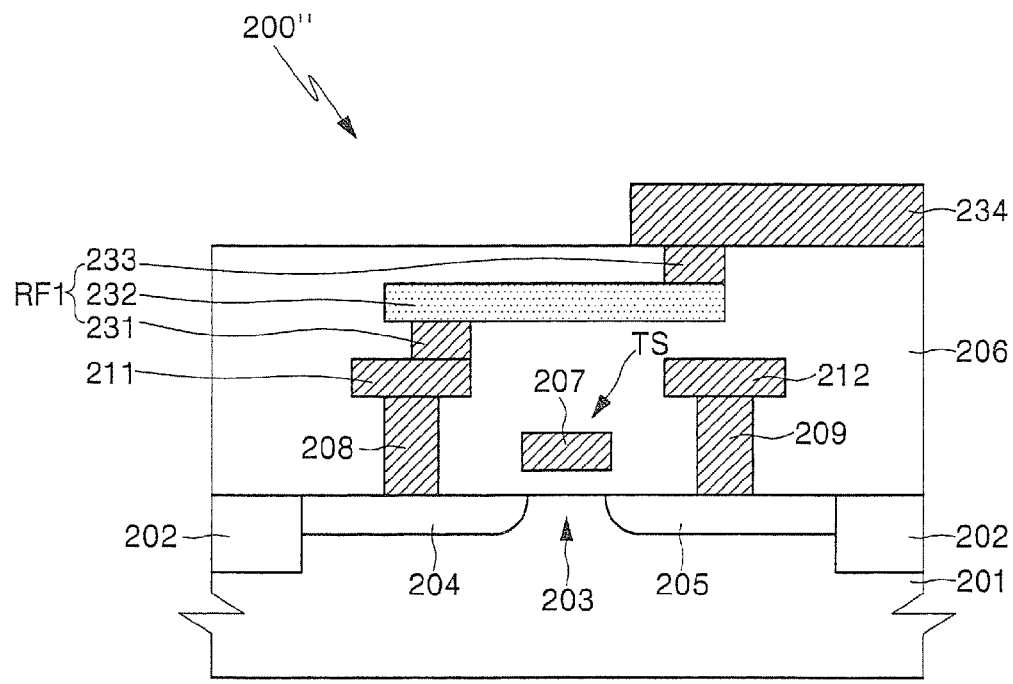
FIG. 9 is a cross-sectional view taken along line II-II' of FIG. 8 illustrating a one-time programmable device in accordance with some embodiments of the present invention.
Figure 10:
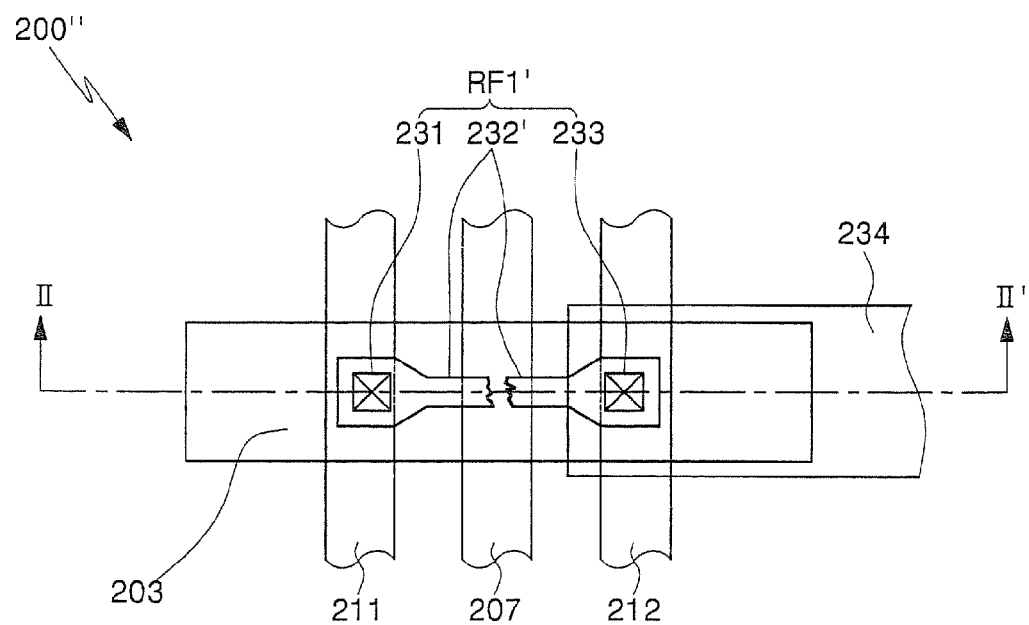
FIG. 10 is a plan view illustrating a program operation of a one-time programmable device in accordance with some embodiments of the present invention.
Figure 11:
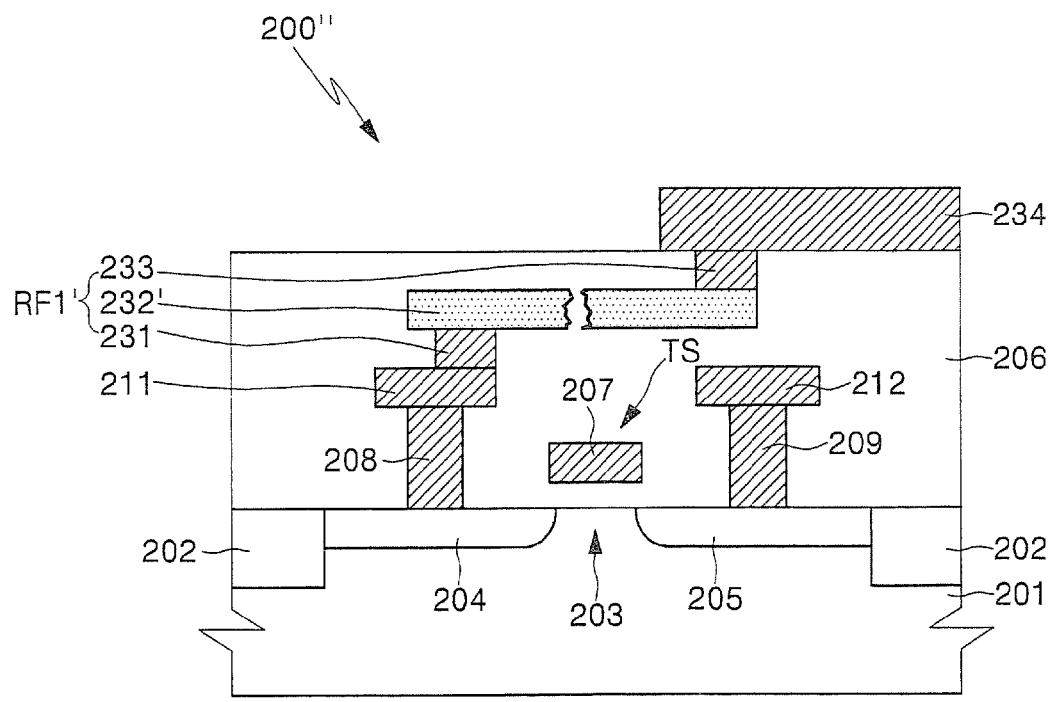
FIG. 11 is a cross-sectional view taken along line II-II' of FIG. 10 illustrating a program operation of a one-time programmable device in accordance with some embodiments of the present invention.

FIGS. 8 and 10 are plan views illustrating a one-time programmable device 200" and its program operation according to other embodiments of the present invention, and FIGS. 9 and 11 are cross-sectional views taken along line II-11' of FIGS. 8 and 10 illustrating the one-time programmable device 200" and its program operation according to these embodiments of the present invention.

Referring to FIGS. 8 and 9, the one-time programmable device 200" according to these embodiments of the present invention may have an isolation layer 202 to define an active region 203 in a semiconductor substrate 201. Differences between these one-time programmable devices 200" and one-time programmable devices 200 according to the embodiments described with reference to FIGS. 4 to 7 will now be described in brief.

An insulated gate electrode 207 may be disposed across the active region 203. A drain region 204 and a source region 205 may be disposed in the active region 203 adjacent to opposite sides of the gate electrode 207. The gate electrode 207, the active region 203, the drain region 204, and the source region 205 may constitute a switching transistor TS. The gate electrode 207 may be connected to the gate power line (W1 of FIG. 2).

The gate electrode 207, the drain region 204, and the source region 205 may be covered by an interlayer insulating layer 206. A first interconnection 211 may be disposed within the interlayer insulating layer 206. The first interconnection 211 may be electrically connected to the drain region 204 by a first contact plug 208. A second interconnection 234 may be disposed on the interlayer insulating layer 206. A fuse RF1 may be disposed between the first interconnection 211 and the second interconnection 234. The fuse RF1 may be disposed within the interlayer insulating layer 206. The second interconnection 234 may be connected to a power supply line Vcc.

The fuse RF1 may include a first electrode 231, a second electrode 233, and a chalcogenide pattern 232. The first electrode 231 may be in contact with the first interconnection 211. The second electrode 233 may be disposed above the first electrode 231. The chalcogenide pattern 232 may be disposed between the first electrode 231 and the second electrode 233. That is, one end of the chalcogenide pattern 232 may be in contact with the first electrode 231, and the other end of the chalcogenide pattern 232 may be in contact with the second electrode 233.

The chalcogenide pattern 232 may have a bar shape as shown in FIG. 8. The chalcogenide pattern 232 may have a relatively large width near the first electrode 231 and the second electrode 233. In addition, the chalcogenide pattern 232 may have combined thin and thick patterns. The chalcogenide pattern 232 may electrically connect the first electrode 231 to the second electrode 233. The second electrode 233 may be electrically connected to the second interconnection 234.

The first electrode 231 may comprise Ti, Zr, Hf, V, Nb, Ta, W, TiN, ZrN, HfN, VN, NbN, TaN, WN, CoSi, TiSi, TaSi, NiSi, TiAlN, TiCN, TaCN, TiSiN and/or TaSiN. The chalcogenide pattern 232 may be an alloy of Ge, Sb and Te. The second electrode 233 may be a conductive layer such as a titanium nitride layer.

A third interconnection 212 may be disposed within the interlayer insulating layer 206. The third interconnection 212 may be electrically connected to the source region 205 by a third contact plug 209. The third interconnection 212 may be connected to a ground line Vss or a source line.

Referring to FIGS. 10 and 11, a program gate voltage higher than a threshold voltage may be applied to the gate electrode 207, and a program voltage may be applied to the second interconnection 234. In this case, a program current may flow through the fuse RF1. When the program current has a magnitude that can cut the fuse RF1, the fuse RF1 may be cut by the program current.

As shown in FIG. 10, the chalcogenide pattern 232 may have combined thin and thick patterns. The chalcogenide pattern 232 may be cut by the program current. For example, the thinnest portion of the chalcogenide pattern 232 may be cut.

The cut chalcogenide pattern 232' may act to electrically insulate the first electrode 231 from the second electrode 233. That is, the cut chalcogenide pattern 232', the first electrode 231, and the second electrode 233 may constitute a cut fuse RF1'. The cut fuse RF1' may have an electrical resistance higher than the fixed resistor (R2 of FIG. 2).

The chalcogenide pattern 232 may be cut even by a relatively small program current compared to a metal or polysilicon layer. Accordingly, the size of the switching device may be reduced or minimized. That is, a one-time programmable device advantageous to high integration may be implemented.

Figure 12:
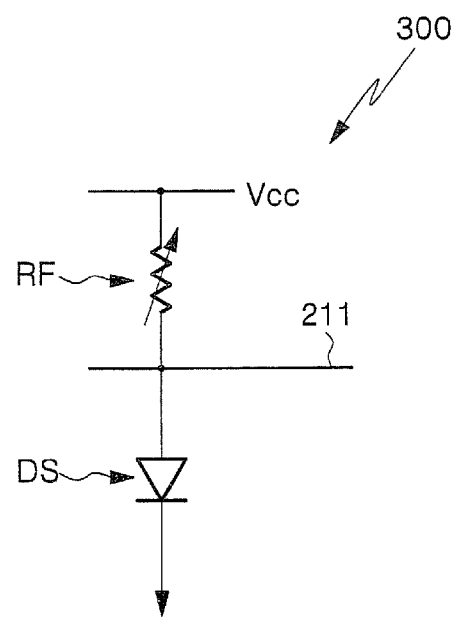
FIG. 12 is an equivalent circuit diagram illustrating a one-time programmable device in accordance with some embodiments of the present invention.
Figure 13:
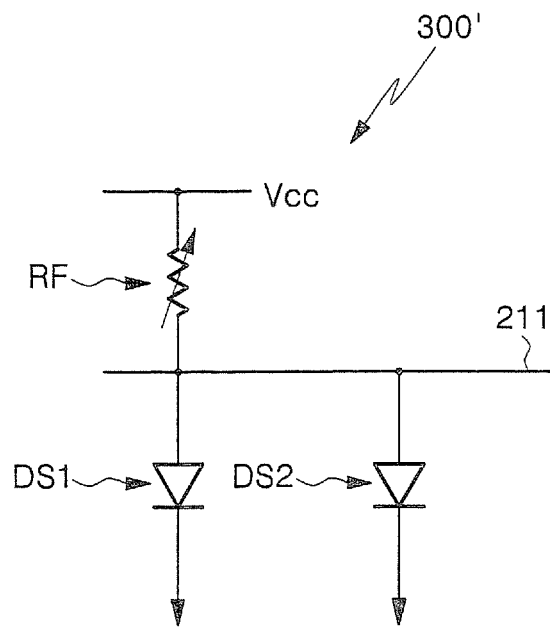
FIG. 13 is an equivalent circuit diagram illustrating a one-time programmable device in accordance with some embodiments of the present invention.

FIG. 12 is an equivalent circuit diagram illustrating a one-time programmable device in accordance with other embodiments of the present invention, and FIG. 13 is an equivalent circuit diagram illustrating a one-time programmable device in accordance with yet other embodiments of the present invention.

Referring to FIG. 12, a one-time programmable device 300 according to these embodiments of the present invention may include a switching diode DS and a fuse RF. The switching diode DS may act as a switching device. One end of the switching diode DS may be electrically connected to one end of the fuse RF through a first interconnection 211. The other end of the fuse RF may be connected to a power supply line Vcc.

Referring to FIG. 13, a one-time programmable device 300' according to these embodiments of the present invention may include first and second switching diodes DS1 and DS2, and a fuse RF. The first and second switching diodes DS1 and DS2 may act as switching devices. The first and second switching diodes DS1 and DS2 may be electrically connected to one end of the fuse RF through a first interconnection 211. The other end of the fuse RF may be connected to a power line Vcc.

The first and second switching diodes DS1 and DS2 may be connected in parallel with each other as illustrated. Accordingly, they may have relatively high current drivability.

As described with reference to FIG. 2, the program current IW may have a magnitude that can cut the fuse RF. Therefore, the switching device should have a current drivability that can cut the fuse RF. Accordingly, a plurality of diodes may be connected to each other to implement the switching device. Further, a plurality of diodes and a plurality of transistors may be combined with each other to implement the switching device.

A one-time programmable device 300 and its programming operation according to some embodiments of the present invention will now be described with reference to FIGS. 14 to 16.

Figure 14:
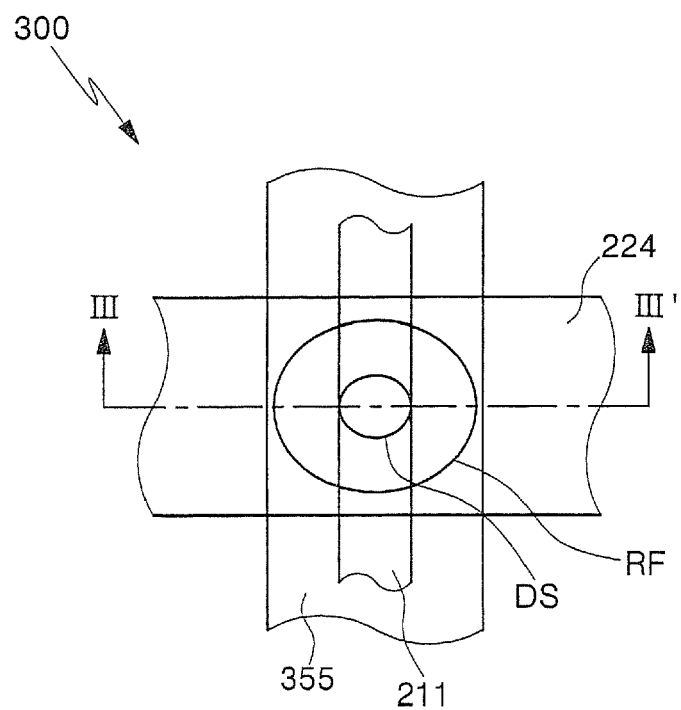
FIG. 14 is a plan view illustrating a one-time programmable device in accordance with some embodiments of the present invention.
Figure 15:
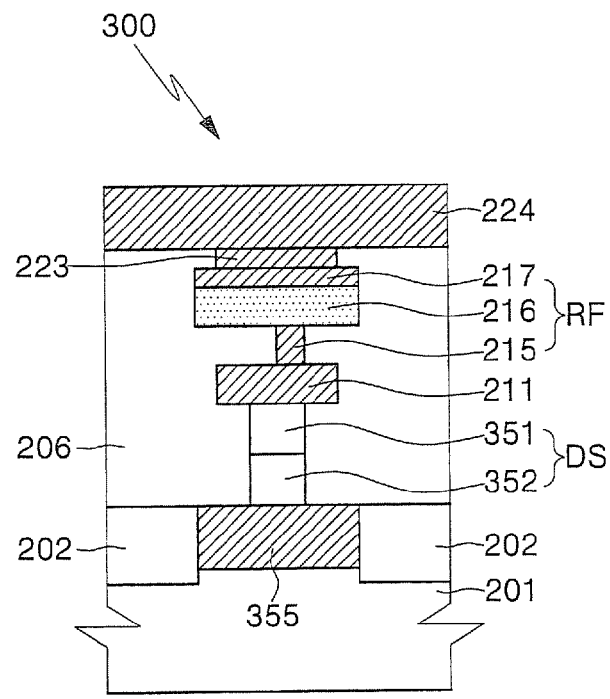
FIGS. 15 and 16 are cross-sectional views taken along line of FIG. 14 illustrating a program operation of a one-time programmable device in accordance with some embodiments of the present invention.

Referring to FIGS. 14 and 15, the one-time programmable device 300 according to these embodiments of the present invention may have an isolation layer 202 disposed in a semiconductor substrate 201. Differences between one-time programmable devices 300 and one-time programmable devices 200 according to the embodiments described with reference to FIGS. 4 to 7 will now be described in brief.

A fourth interconnection 355 may be disposed in the semiconductor substrate 201 having the isolation layer 202. The fourth interconnection 355 may be a high-concentration impurity implantation region or a conductive layer. The semiconductor substrate 201 having the fourth interconnection 355 may be covered by an interlayer insulating layer 206.

A switching diode DS, a first interconnection 211, and a fuse RF may be disposed within the interlayer insulating layer 206. A second interconnection 224 may be disposed on the interlayer insulating layer 206.

The switching diode DS may have an n-type semiconductor region 352 and a p-type semiconductor 351 region which are sequentially stacked. The n-type semiconductor 352 may be electrically connected to the fourth interconnection 355, and the p-type semiconductor 351 may be electrically connected to the first interconnection 211. The fuse RF may be disposed between the first interconnection 211 and the second interconnection 224. The second interconnection 224 may be connected to a power supply line Vcc.

The fuse RF may have a first electrode 215, a second electrode 217, and a chalcogenide pattern 216. The first electrode 215 may be in contact with the first interconnection 211. The second electrode 217 may be disposed above the first electrode 215. The chalcogenide pattern 216 may be disposed between the first electrode 215 and the second electrode 217. A contact region between the first electrode 215 and the chalcogenide pattern 216 may have a smaller width than the chalcogenide pattern 216. The chalcogenide pattern 216 may electrically connect the first electrode 215 to the second electrode 217. The second electrode 217 may be electrically connected to the second interconnection 224 by a second contact plug 223.

The first electrode 215 may include Ti, Zr, Hf, V, Nb, Ta, W, TiN, ZrN, HfN, VN, NbN, TaN, WN, CoSi, TiSi, TaSi, NiSi, TiAlN, TiCN, TaCN, TiSiN and/or TaSiN. The chalcogenide pattern 216 may be an alloy of Ge, Sb and Te. The second electrode 217 may be a conductive layer such as a titanium nitride layer.

Figure 16:
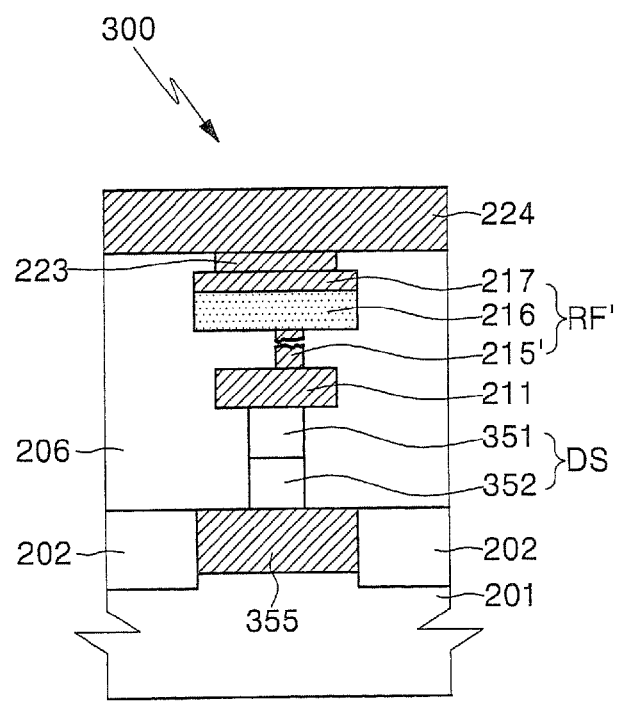

Referring to FIGS. 14 and 16, the fourth interconnection 355 may be selected, and a program voltage may be applied to the second interconnection 224. In this case, a program current may flow through the fuse RF. When the program current has a magnitude that can cut the fuse RF, the fuse RF may be cut by the program current.

As shown in FIG. 16, the first electrode 215 may have a cross-sectional area smaller than the chalcogenide pattern 216. In addition, the first electrode 215 may have combined thin and thick patterns. The first electrode 215 may be cut by the program current. For example, the thinnest portion of the first electrode 215 may be cut. The switching diode DS may have a current drivability that can cut the first electrode 215.

The cut first electrode 215' may act to electrically insulate the chalcogenide pattern 216 from the first interconnection 211. That is, the cut first electrode 215', the chalcogenide pattern 216, and the second electrode 217 may constitute a cut fuse RF'. The cut fuse RF' may have an electrical resistance higher than the fixed resistor (R2 of FIG. 2).

Figure 17:
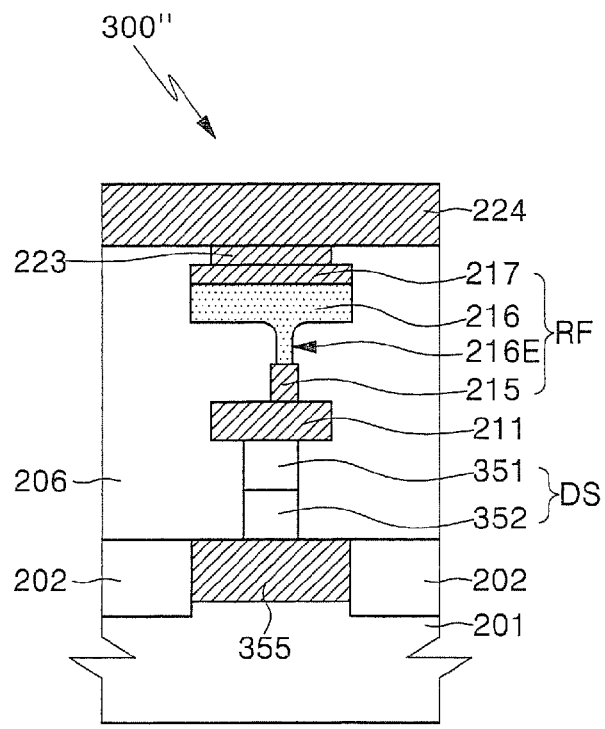
FIGS. 17 and 18 are cross-sectional views taken along line III-III' of FIG. 14 illustrating a program operation of a one-time programmable device in accordance with some embodiments of the present invention.
Figure 18:
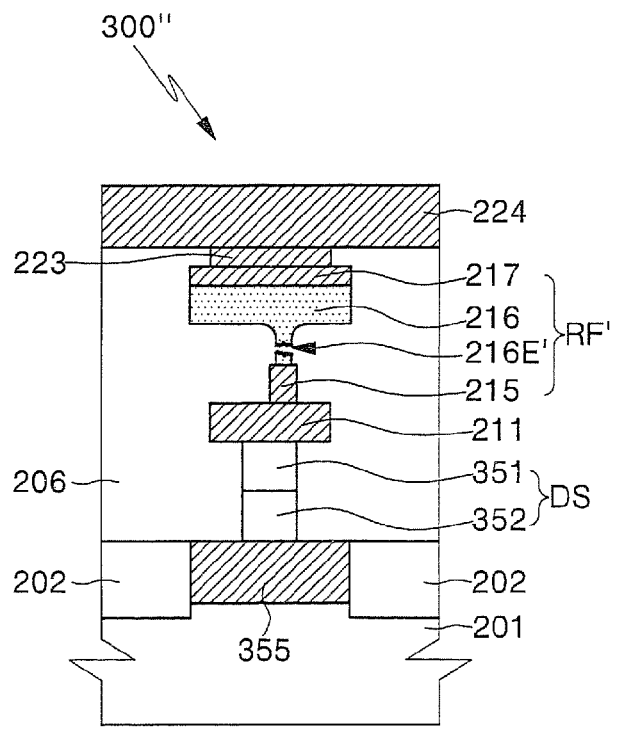

FIGS. 17 and 18 are cross-sectional views taken along line III-III' of FIG. 14 illustrating a program operation of a one-time programmable device in accordance with some embodiments of the present invention.

Referring to FIG. 17, a one-time programmable device 300" according to these some embodiments of the present invention may have an isolation layer 202 disposed in a semiconductor substrate 201. Differences between one-time programmable devices 300" and one-time programmable devices 300 according to embodiments described with reference to FIGS. 15 and 16 will now be described in brief.

A fourth interconnection 355 may be disposed in the semiconductor substrate 201 having the isolation layer 202. The fourth interconnection 355 may be a high-concentration impurity implantation region or a conductive layer. The semiconductor substrate 201 having the fourth interconnection 355 may be covered by an interlayer insulating layer 206.

A switching diode DS, a first interconnection 211, and a fuse RF may be disposed within the interlayer insulating layer 206. A second interconnection 224 may be disposed on the interlayer insulating layer 206.

The switching diode DS may have an n-type semiconductor region 352 and a p-type semiconductor region 351 which are sequentially stacked. The n-type semiconductor 352 may be electrically connected to the fourth interconnection 355, and the p-type semiconductor 351 may be electrically connected to the first interconnection 211. The fuse RF may be disposed between the first interconnection 211 and the second interconnection 224. The second interconnection 224 may be connected to a power line Vcc.

The fuse RF may have a first electrode 215, a second electrode 217, and a chalcogenide pattern 216. The first electrode 215 may be in contact with the first interconnection 211. The second electrode 217 may be disposed above the first electrode 215. The chalcogenide pattern 216 may be disposed between the first electrode 215 and the second electrode 217.

The chalcogenide pattern 216 may have an extension 216E. The extension 216E may have a smaller width than the first electrode 215. The extension 216E may be in contact with the first electrode 215. In this case, a contact region between the extension 216E and the first electrode 215 may be smaller than a cross-sectional area of the first electrode 215. The chalcogenide pattern 216 may electrically connect the first electrode 215 to the second electrode 217. The second electrode 217 may be electrically connected to the second interconnection 224 by a second contact plug 223.

The first electrode 215 may include Ti, Zr, Hf, V, Nb, Ta, W, TiN, ZrN, HfN, VN, NbN, TaN, WN, CoSi, TiSi, TaSi, NiSi, TiAlN, TiCN, TaCN, TiSiN and/or TaSiN. The chalcogenide pattern 216 may be an alloy of Ge, Sb, and Te. The extension 216E may also be an alloy of Ge, Sb, and Te. The second electrode 217 may be a conductive layer such as a titanium nitride layer.

Referring to FIG. 18, the fourth interconnection 355 may be selected, and a program voltage may be applied to the second interconnection 224. In this case, a program current may flow through the fuse RF. When the program current has a magnitude that can cut the fuse RF, the fuse RF may be cut by the program current.

As shown in FIG. 18, the extension 216E may have a cross-sectional area smaller than the first electrode 215. The extension 216E may be cut by the program current. For example, the thinnest portion of the extension 216E may be cut. The switching diode DS may have a current drivability that can cut the extension 216E.

The cut extension 216E' may act to electrically insulate the first electrode 215 from the second electrode 217. That is, the first electrode 215, the cut extension 216E', the chalcogenide pattern 216, and the second electrode 217 may constitute a cut fuse RF'. The cut fuse RF' may have an electrical resistance higher than the fixed resistor (R2 of FIG. 2).

FIGS. 6, 7, 10, 11, 16 and 18 also illustrate methods of programming a fuse that comprises chalcogenide material by supplying sufficient current to a fuse to cut the fuse. In some embodiments, the chalcogenide material itself is cut. These figures also illustrate fuses according to other embodiments of the present invention, wherein the fuses comprise a substrate and a fuse body that comprises chalcogenide material on the substrate, the fuse including a cut portion therein that separates the fuse body into two closely spaced apart regions. In some embodiments, the chalcogenide material itself is cut. Finally, FIGS. 1 and 2 also illustrate phase change memory devices according to other embodiments of the invention that comprise an integrated circuit substrate including an array of phase change memory cells that comprise a phase change material, an array of redundant phase change memory cells that comprise the phase change material and a circuit that is configured to substitute at least one redundant phase change memory cell for at least one phase change memory cell that is defective. The circuit includes at least one fuse that also comprises the phase change material.

Figure 19:
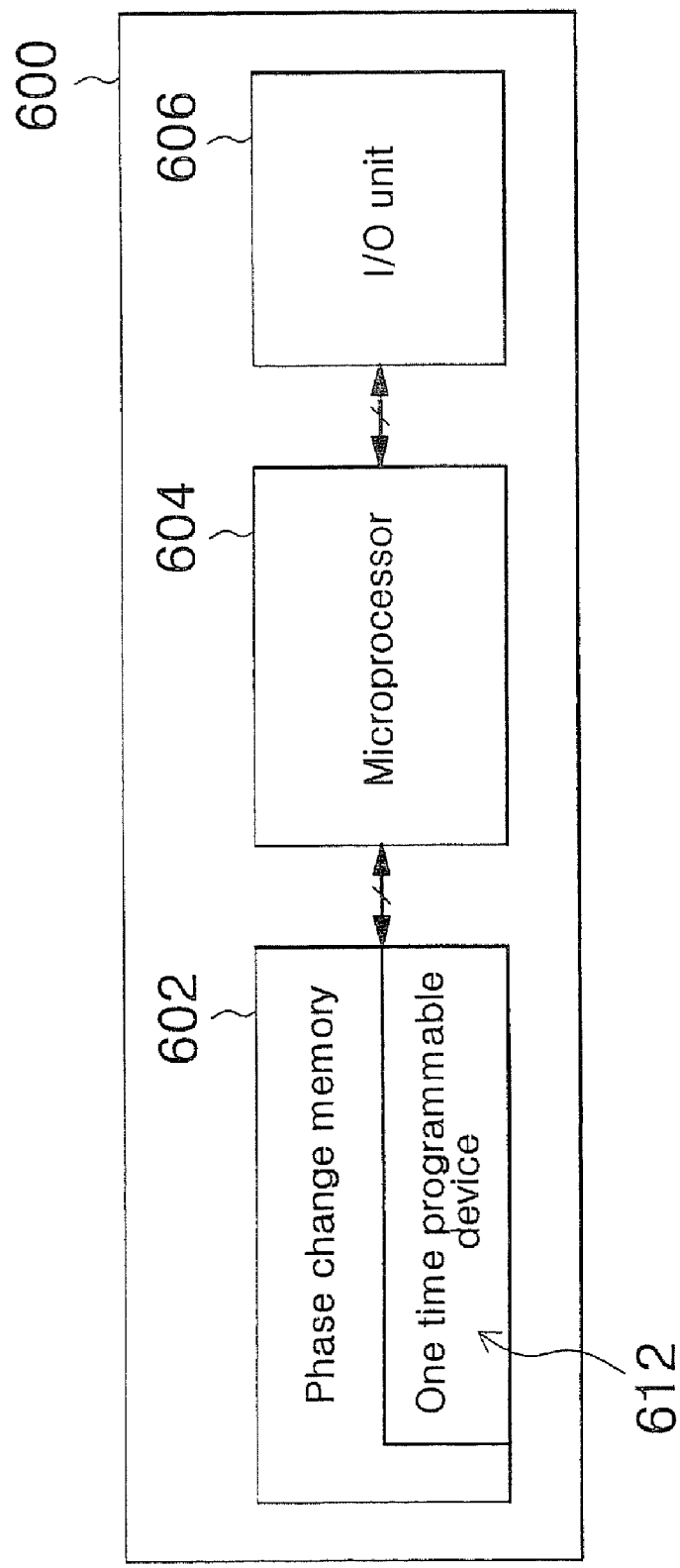
FIG. 19 schematically illustrates an electronic system employing one-time programmable devices in accordance with some embodiments of the present invention.

FIG. 19 is a schematic block diagram of an electronic system 600 employing one-time programmable devices in accordance with embodiments of the present invention.

Referring to FIG. 19, the electronic system 600 may include a phase change memory device 602, and a microprocessor 604 electrically connected to the phase change memory device 602.

In this case, the phase change memory device 602 may have a one-time programmable device 612, a phase change memory cell, and a redundancy memory cell as described with reference to FIGS. 1 to 18. The electronic system 600 may correspond to a portion of a portable notebook computer, a digital video camera, a cellular phone or another electronic device. In this case, the microprocessor 604 and the phase change memory device 602 may be disposed on a board, and the phase change memory device 602 may act as data storage media for execution of stored programs for the microprocessor 604.

The electronic system 600 may exchange data with other electronic systems such as a personal computer or a network of computers via an I/O unit 606. The I/O unit 606 may use a peripheral bus line of a computer, a high speed digital transmission line and/or a wireless transmitting/receiving antenna to provide data. Data communication between the microprocessor 604 and the I/O unit 606 along with data communication between the microprocessor 604 and the phase change memory device 602 may be performed using typical computer bus architectures.

Figure 20:
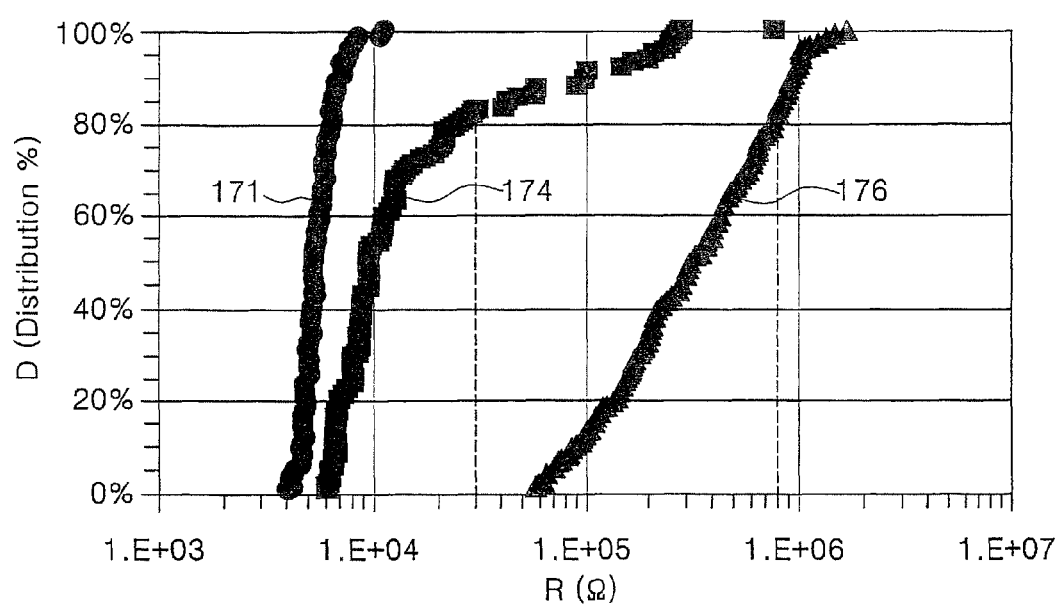
FIG. 20 is a graph showing the resistance characteristics of program operation test results of a one-time programmable device in accordance with some embodiments of the present invention.

FIG. 20 is a graph showing the resistance characteristics of program operation test results of a one-time programmable device in accordance with some embodiments of the present invention. A horizontal axis of FIG. 20 denotes a resistance R and its unit is Ω. A vertical axis of FIG. 20 denotes a distribution D and its unit is %.

Referring to FIG. 20, a one-time programmable device was manufactured to include a fuse having first and second electrodes and a chalcogenide pattern between the first and second electrodes. The first electrode was formed of TiAlN and had a pillar structure having a diameter of 60 nm. The chalcogenide pattern was formed of an alloy of Ge, Sb, and Te to have a cross-sectional area larger than the first electrode. The second electrode was formed of TiN to cover the chalcogenide pattern.

A curve 171 indicates a distribution of initial resistance measurements obtained from the fuse, a curve 174 indicates a distribution of resistance measurements obtained after a current of 4 mA is applied to the fuse for 500 ns, and a curve 176 indicates a distribution of resistance measurements obtained after a current of 6 mA is applied to the fuse for 500 ns.

As shown in the curves 176 and 174, it can be found that the fuse can be cut by the applied program current.

According to various embodiments the present invention as described above, a one-time programmable device having a switching device and a fuse may be provided. The fuse may have first and second electrodes and a chalcogenide pattern between the first and second electrodes. In some embodiments, the fuse can be cut even by a relatively small program current compared to a conventional metal or polysilicon layer. Thus, a one-time programmable device can be highly integrated.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A one-time programmable device, comprising:
a substrate;
a switching device disposed in the substrate; and
a fuse disposed in the substrate, the fuse including a first electrode electrically connected to the switching device, a second electrode spaced apart from the first electrode, and a chalcogenide pattern disposed between the first and second electrodes, such that the first electrode is on a first side of the chalcogenide pattern and the second electrode is on a second side of the chalcogenide pattern that is opposite the first side,
wherein the switching device is programmed to apply sufficient program current to the fuse to cut the fuse.

2. The one-time programmable device according to claim 1, wherein the fuse includes a cut portion that separates the fuse into two closely spaced apart regions.

3. The one-time programmable device according to claim 1, wherein the switching device comprises a metal oxide semiconductor (MOS) transistor, a plurality of MOS transistors connected in parallel with each other, a diode and/or a plurality of diodes connected in parallel with each other.

4. The one-time programmable device according to claim 1, wherein a contact region between the first electrode and the chalcogenide pattern has a smaller width than the chalcogenide pattern.

5. The one-time programmable device according to claim 1, wherein at least a portion of the chalcogenide pattern has a cross-sectional area smaller than a contact region between the first electrode and the chalcogenide pattern.

6. The one-time programmable device according to claim 1, wherein a portion of the first electrode is cut by the applied program current.

7. The one-time programmable device according to claim 2, wherein the cut portion is in a contact region between the first electrode and the chalcogenide pattern.

8. The one-time programmable device according to claim 2, wherein the cut portion is in the chalcogenide pattern.

9. The one-time programmable device according to claim 1, wherein the first electrode comprises Ti, Zr, Hf, V, Nb, Ta, W, TiN, ZrN, HfN, VN, NbN, TaN, WN, CoSi, TiSi, TaSi, NiSi, TiAlN, TiCN, TaCN, TiSiN and/or TaSiN.

10. The one-time programmable device according to claim 1, wherein the chalcogenide pattern comprises an alloy of Germanium (Ge), Stibium (Sb) and Tellurium (Te).

11. An electronic system comprising a microprocessor, an input/output unit communicating data with the microprocessor, and a one-time programmable device of claim 1 communicating data with the microprocessor.

12. A one-time programmable device, comprising:
a substrate;
a switching device disposed in the substrate; and
a fuse disposed in the substrate, the fuse including a first electrode electrically connected to the switching device, a second electrode spaced apart from the first electrode, and a chalcogenide pattern disposed between the first and second electrodes,
wherein the switching device is programmed to apply sufficient program current to the fuse to cut the fuse, and
wherein the fuse includes a cut portion that separates the fuse into two closely spaced apart regions.

13. The one-time programmable device according to claim 12, wherein the cut portion is in a contact region between the first electrode and the chalcogenide pattern.

14. The one-time programmable device according to claim 12, wherein the cut portion is in the chalcogenide pattern.

15. The one-time programmable device according to claim 14, wherein the chalcogenide pattern comprises an alloy of Germanium (Ge), Stibium (Sb) and Tellurium (Te).

16. The one-time programmable device according to claim 14, wherein at least a portion of the chalcogenide pattern has a cross-sectional area smaller than a contact region between the first electrode and the chalcogenide pattern.

17. A one-time programmable device, comprising:
a substrate;
a switching device disposed in the substrate; and
a fuse disposed in the substrate, the fuse including a chalcogenide pattern, wherein the switching device is programmed to apply sufficient program current to the fuse to cut the fuse,
wherein the fuse includes a cut portion that separates the fuse into two closely spaced apart regions.

18. The one-time programmable device according to claim 17, wherein the cut portion is in the chalcogenide pattern.

19. The one-time programmable device according to claim 18, wherein the fuse includes an electrode electrically connected to the switching device.

* * * * *